United States Patent [19]
Jackson

[11] 4,392,113
[45] Jul. 5, 1983

[54] PHASE-LOCKED LOOP INCLUDING NON-LINEAR PHASE DETECTOR OF THE SAMPLE AND HOLD TYPE

[76] Inventor: Charles R. Jackson, 1200 - 69th St. N., St. Petersburg, Fla. 22519

[21] Appl. No.: 233,904

[22] Filed: Feb. 12, 1981

[51] Int. Cl.³ .............................................. H03L 7/08
[52] U.S. Cl. .......................................... 331/14; 331/8; 331/27; 331/36 C; 307/353
[58] Field of Search ................... 331/1 A, 1 R, 14, 16, 331/17, 18, 25, 27, 8, 36 C; 307/320, 491, 353; 328/133-134, 155, 162

[56] References Cited

U.S. PATENT DOCUMENTS

| | | |
|---|---|---|
| 3,538,450 | 11/1970 | Andrea et al. |
| 3,681,706 | 8/1972 | Harzer .................. 331/14 X |
| 3,863,174 | 1/1975 | Klinger ............................. 331/25 X |

FOREIGN PATENT DOCUMENTS

| | | | |
|---|---|---|---|
| 54-43666 | 4/1979 | Japan ..................................... 331/25 |
| 54-43667 | 4/1979 | Japan ..................................... 331/25 |

OTHER PUBLICATIONS

Underhill et al., "Fast Digital Frequency Synthesizer", Electronics Letters, 25th May 1978, vol. 14, No. 11, pp. 342-343.

Underhill et al., "Split-Loop Method for Wide-Range Frequency Synthesizer with Good Dynamic Performance", Electronics Letters, Jun. 21, 1979, vol. 15, No. 13, pp. 391-393.

Primary Examiner—Siegfried H. Grimm
Assistant Examiner—Edward P. Westin
Attorney, Agent, or Firm—Robert V. Wilder; Albert M. Crowder, Jr.

[57] ABSTRACT

A non-linear phase detector is disclosed which compensates for gains occuring during tuning a frequency generator of a known phase locked loop circuit which incorporates a Varactor tuned resonant circuit as a VCO. The phase detector is of the sample and hold type and incorporates a Varactor rather than a hold capacator to compensate for non-linear gains which occur when tuning the frequency generator across its band spread. Additionally, bias compensation is provided for the resonant circuit Varactor to offset its contact potential.

4 Claims, 8 Drawing Figures

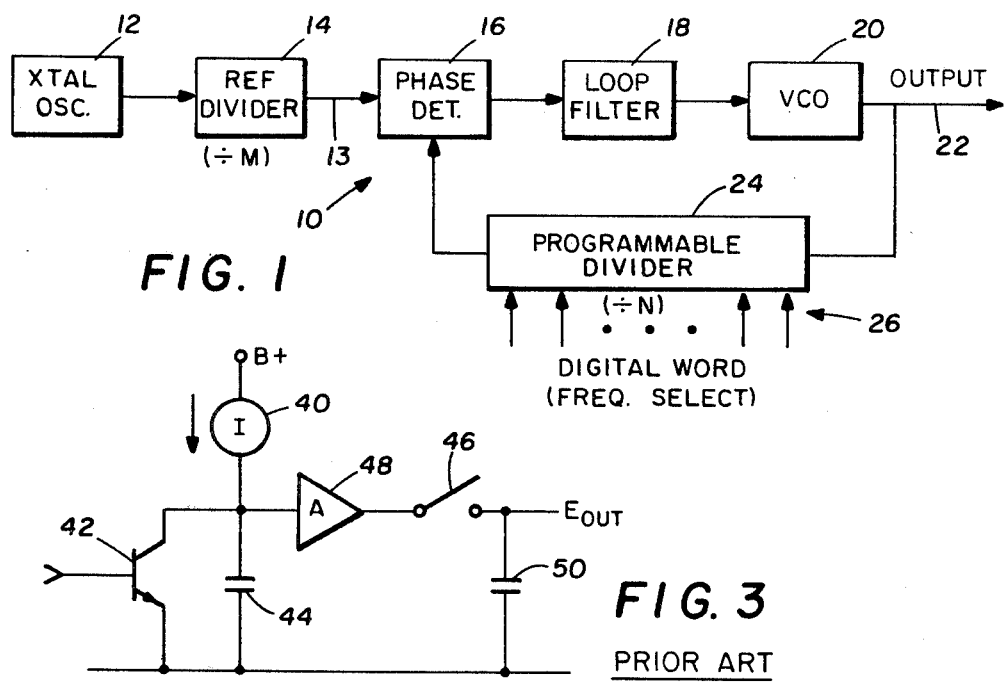
FIG. 1
FIG. 3 PRIOR ART
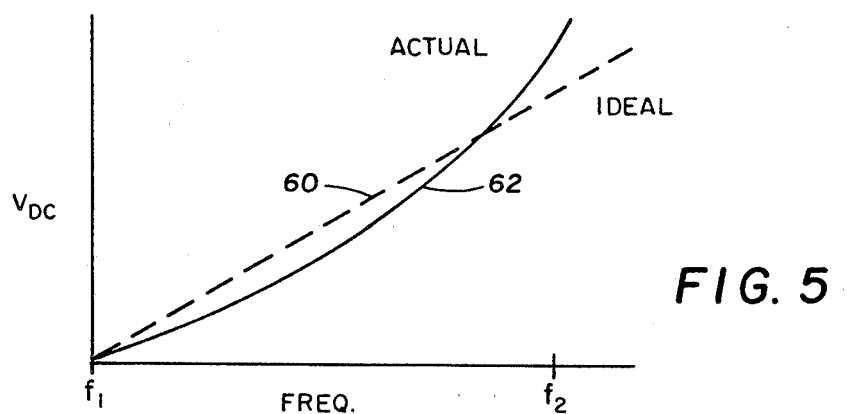
FIG. 4 PRIOR ART
FIG. 5

PHASE-LOCKED LOOP INCLUDING NON-LINEAR PHASE DETECTOR OF THE SAMPLE AND HOLD TYPE

TECHNICAL FIELD

This invention relates to multichannel, single-loop synthesized frequency generators and to phase detectors, and more particularly to a non-linear phase detector including circuitry for providing zero loop gain variation within the phase locked loop when the frequency of the voltage controlled oscillator is changed.

BACKGROUND ART

Critical frequency stability requirements placed on modern communications equipment have forced the development of phase locked loop technology and associated hardware and circuits. For example, a single-loop synthesized frequency generator provides thousands of accurate channels through frequency synthesis using a single crystal oscillator. The generator is tuned from channel to channel using a phase locked loop containing a voltage controlled oscillator VCO) to generate the desired output signal.

One of the more common types of VCO is tuned using an abrupt junction voltage variable capacity diode (VARACTOR). By changing the input tuning voltage to the resonant circuit containing the varactor, the output frequency of the generator may be varied. However, in conventional phase locked loop circuits required to operate over an appreciable frequency range, the loop gain varies excessively with frequency changes. In many applications, such variation in loop gain is unacceptable. Further, the relationship between output frequency and input tuning voltage is non linear so that retuning the VCO causes the loop gain within the phase locked loop to vary.

Various prior art methods have been utilized to overcome this problem. One such method is found in U.S. Pat. No. 3,538,450, Andrea et al., which discloses a phase locked loop circuit in which a reference signal source is controlled digitally. In Andrea et al., one or more of a bank of fixed capacitors having values which increase in a binary order are selected for controlling the frequency of a signal source. A binary counter, responsive to the output of a clock pulse source counts up or down to control a switch, which in turn adds to or subtracts from the oscillator circuit discrete increments of capacitance from the bank of capacitors. Thus the amount of capacitance coupled into the oscillator circuit is determined from the number of pulses clocked into the counter. However, the addition or subtraction of discrete increments of capacitance is a linear function which can only approximate the non-linear gain variations created by frequency changes of the generator.

Accordingly, there is a need for a phase locked loop circuit which automatically compensates for non-linear gain variations within the loop which are caused by changing the output frequency of the generator.

DISCLOSURE OF THE INVENTION

The present invention is directed to a non-linear phase detector for providing offset gain compensation for gain variations occurring during frequency changes in a phase locked loop circuit.

In accordance with one embodiment of the present invention, a non-linear phase detector is incorporated in a a phase locked loop circuit which controls the frequency of a voltage controlled oscillator (VCO). The non-linear phase detector provides a non-linear voltage ramp signal by incorporating a Varactor as the ramping capacitor in the sample and hold circuit of the detector. By selecting a Varactor having the correct non-linear ramp characteristics in accordance with the characteristics of another Varactor incorporated in the resonant tuning circuit of the generator and used to control the output signal of the voltage controlled oscillator, the gain variation of the phase locked loop during frequency changes may be set to zero. Accordingly, the phase locked loop gain ratio for any two frequencies may be set to unity so that the phase locked loop gain does not change when the frequency of the VCO is changed, even for frequency changes over appreciable ranges.

In an alternate embodiment, the selection of the proper Varactor characteristics may be assisted by providing for bias compensation to negate the contact potential of the tuning Varactor for the voltage controlled oscillator.

BRIEF DESCRIPTION OF THE DRAWINGS

For more complete understanding of the present invention and advantages thereof, reference is now made to the following description taken in conjunction with the accompanying diagrams in which:

FIG. 1 is a block diagram illustrating a single loop synthesized frequency generator incorporating frequency selection by a programmable divider (digital) contained in a feedback loop.

FIG. 3 is a schematic diagram illustrating a sample-and-hold circuit used in phase detectors of the prior art.

FIGS. 4(A and B) shows respectively the sample pulse and resultant ramp voltage impressed across the ramp capacitor in the prior art sample-and-hold circuit of FIG. 3.

FIG. 5 is a graph illustrating the non linearity of the control voltage used to tune the VCO, in volts DC, plotted against the output frequency of the frequency generator of FIG. 1 as compared with an ideal case.

DETAILED DESCRIPTION

Figure 6:
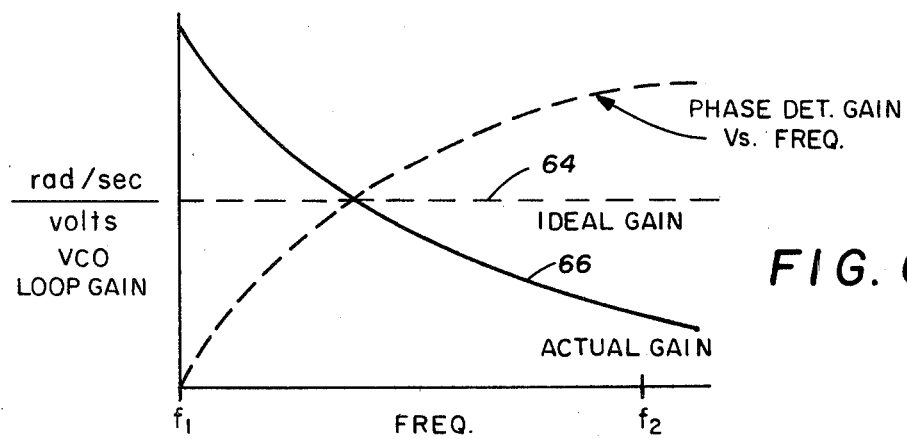
FIG. 6 illustrates the voltage controlled oscillator loop gain in radians per second per volt plotted against frequency and compared with an ideal gain and the loop gain of the non-linear phase detector of the present invention.

Referring to FIG. 1, there is shown a single loop synthesized frequency generator, generally at 10. Typically, frequency generator 10 includes a crystal oscillator 12 that produces a highly stable base frequency signal. The crystal oscillator signal is coupled into a divider network 14 which reduces the crystal oscillator output frequency to a preselected reference frequency.

The reference signal at conductor 13 is coupled into a phase detector 16 where, as will be hereinafter explained, it is combined with a feedback signal to develop an error offset signal for controlling the output frequency of a voltage controlled oscillator (VCO 20). The error signal is coupled through loop filter 18 into voltage controlled oscillator 20 to drive a tuned circuit (30 in FIG. 2) to resonance for providing a preselected output frequency on conductor 22. The output frequency on conductor 22 is coupled into a programable divider network 24 which acts as an adjustable frequency divider. As shown, programmable divider 24 is a digital device which permits selection of a desired frequency by inputting a frequency-select digital word over input lines 26 into programmable divider 24. The divider output signal is then coupled into a phase detector 16 where it is compared with the frequency reference signal from reference divider 14. The comparison provides an error voltage signal which operates to drive the voltage controlled oscillator (VCO 20) to resonance at the desired output frequency. The error voltage is proportional to the phase difference between the reference and VCO derived signals. The closed loop forces the VCO to attain an output frequency precisely equal to "N" times the reference 13.

Most phase locked loop circuits of the type above described include a voltage controlled oscillator 20 which incorporates a resonant circuit tunable across the desired output signal frequency bandspread. Although various types of VCO designs are known, one of the more common types utilizes an abrupt junction voltage variable capacitor (or Varactor) for tuning. As will be hereinafter explained in greater detail, the relationship between output frequency and input tuning voltage is non-linear with the phase locked loop loop-gain varying as the VCO is re-tuned to a new frequency. For phase locked loops covering appreciable frequency ranges, this loop-gain variation becomes excessive which can cause drastic changes in loop dynamics. Critical phase locked loop parameters such as noise, bandwidth, damping factor, acquisition time, tracking error and lock range show considerable variation across the tuning range.

Figure 2:
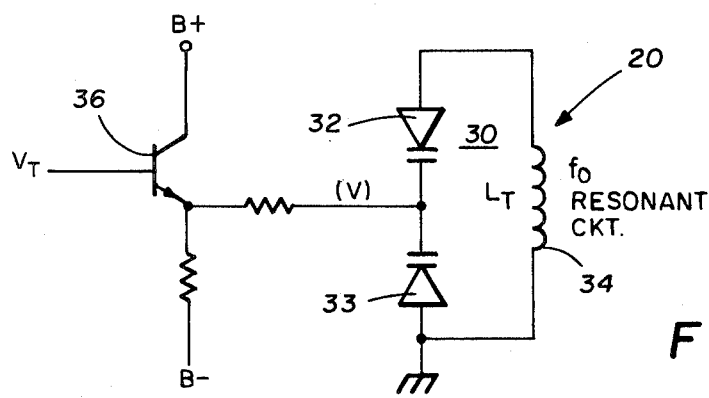
FIG. 2 is a schematic diagram of a bias compensation circuit incorporated in a drive circuit that negates the contact potential of the Varactor junction contained in the tuned resonant circuit of the voltage controlled oscillator of the frequency generator of FIG. 1.

Referring now to FIG. 2, there is shown the resonant circuit 30 of the voltage controlled oscillator 20 utilizing a pair of Varactors, 32 and 33 respectively, interconnected with an inductive coil ($L_T$) 34 to provide resonance of circuit 30 across a preselected band spread extending from a first frequency, $f_1$, to a second frequency, $f_2$, at the selected resonant frequency, $f_0$.

When used for tuning, Varactors 32 and 33 may generally be described by the relationship $$C = \frac{C_0}{\left(1 + \frac{v}{\phi}\right)^\gamma} \quad (1)$$

where
C is the capacitance at V volts
$\phi$ is the contact potential of the Varactors junction, usually 0.6 to 0.8 volts.
V is the Bias voltage
$\gamma$ is the tuning exponent
$C_0$ is the capacitance at V=0 VDC However, equation (1) can be simplified by either using the Varactor at a bias voltage that is much larger than the contact potential ($\phi$) or using a bias compensation scheme in the dual circuit that negates the contact potential ($\phi$). Accordingly, and referring still to FIG. 2, a transistor 36 is positioned between the input error signal, $V_T$ and the interconnection between Varactors 32 and 33. Transistor 36 is biased to provide an offset voltage signal (V) which is coupled into the junction between Varactors 32 and 33. An equation for voltage (V) may be written as:

$$V = V_T - \phi$$

which permits us to rewrite equation (1) as follows:

$$C = C_0 \phi^\gamma / (V + \phi)^\gamma$$

$$C = C_0 \phi^\gamma / (V_T - \phi + \phi)^\gamma$$

$$C = C_0 \phi^\gamma / (V_T)^\gamma \text{ or } K_1 / (V_T)^\gamma,$$

since $C_0 \phi^\gamma$ is a constant across the tuning range. In analyzing the Varactor circuits to determine the gain variations which exist during tuning the VCO from the first or lower frequency of the VCO's band spread ($f_1$) to the second or upper frequency of the VCO band spread ($f_2$) the following terminology will be utilized:

GLOSSARY OF TERMS $f_1$ = Lower frequency of VCO;
$f_2$ = Upper frequency of VCO;
$V_1$ = Lower tuning voltage;
$V_2$ = Upper tuning voltage;
X = Varactor exponent in VCO circuit;
Y = Varactor exponent in phase detector circuit;
K = Various constants;
$S_0$ = VCO gain factor (df/dv); and
$G_0$ = phase detector gain factor dV/dt)

Additionally, and referring to FIG. 2, it is assumed that the resonant circuit contains no fixed capacitance, that the Varactor exponent remains constant vs. frequency vs. voltage and that the standard resonance frequency, $f = 1/(2\pi\sqrt{LC})$ may be reduced to $f = K_2/\sqrt{C}$ wherein $K_2 = 1/(2\pi\sqrt{L})$, since the resonant circuit coil 34 is fixed so that $K_2$ is a constant which is equal to $1/2\pi\sqrt{L}$ and, further, where the Varactor provides the tuning capacitance with the simplified expression $$C = K/(V)^x$$

Substitution then provides $$f = K_3(V)^{x/2} \quad (2)$$

Taking the first derivative of equation (2) gives us the VCO gain, that is $$\text{VCO gain} = S = df/dv,$$

$$S = df/dv = (d/dv)[(K_3(V)^{X/2})],$$

which reduces to $$S = (x/2)K_3 V^{(x/2-1)}$$

Whereby $$S = (K_3 V^{x/2})(X/2)(V^{-1}).$$

Substituting into equation (2) gives $$S_o = f_o X/2V \quad (3)$$

Next, to determine the gain variation when the oscillator tunes from $f_1$ to $f_2$, substitute parameters for $f_1$ and $f_2$ into equation 3 such that $$S_1 = f_1 x/2v_1 \text{ and } S_2 = f_2 x/2V_2$$

Additionally, from equation 2 we can derive the general form $$V = (f/K_3)^{(2/x)} \quad (4)$$

such that, $$V_1 = (f_1/K_3)^{2/x} \text{ and } V_2 = (f_2/K_3)^{2/x}$$

Substituting these voltage equations into the sensitivity equation (3) gives:

$$S_1 = \frac{f_1 X}{2V_1} = \frac{f_1 X}{2\left(\frac{f_1}{K_3}\right)^{(2/X)}}$$

$$= \frac{f_1^{(1-2/X)}(x) K_3^{(2/x)}}{2}$$

and, correspondingly, $$S_2 = f_2^{(1-2/X)}(x)(K_3^{(2/x)})/2$$

The ratio of VCO sensitivities then becomes $$S_R = S_1/S_2 = (f_1/f_2)^{(1-2/X)}$$

which may be rearranged into the form $$S_R = (f_2/f_1)^{(2-x)/2} \quad (5)$$

By way of example, consider the following parameters during tuning the voltage control oscillator of FIG. 1 across a preselected bandspread such that:

$f_1 = 300.000$ MHz
$f_2 = 399.975$ MHz and
$X = 0.45$, such that
$S_R = (399.975/300.000)(2 - 0.45)/0.45$
$S_R = 2.693$ Thus, it may be seen that for a tuning range of approximately 1.33 to 1, the change in loop gain is nearly 2.7 to 1. Further, in the phase lock loop this gain variation change in loop gain is not tolerable due to stability and settling requirements of the circuits.

Further, the overall phase locked loop gain is a product of at least four terms: at $\omega = 1$, Gain = $S_O \times G_O \times 1/N \times K_{DC}$, where: N is the division ratio in the feedback loop and $K_{DC}$ is a DC gain term which takes into account DC amplifiers, level shifting and integrators that often form a part of control processing in the loop and thereby modify the above gain equation.

Referring now to FIGS. 3 and 4, there is shown a sample and hold phase detector, a common phase detection method, for use as the phase detector 16 depicted in FIG. 1. Well known in the art, the conventional sample and hold phase detector provides for a reset transistor 42 actuated by the application of reset pulse 43 (shown in FIG. 4A) to the base of transistor 42. This permits the output of constant current generator 40 to be coupled to ground. When reset pulse 43 transitions to 0, the output of constant current generator 40 is coupled into ramp capacitor 44 to provide the voltage ramp signal 45 (FIG. 4B). Sampling switch 46 is controlled by the output of programmable divider 24 which is coupled into phase detector 16 (both of FIG. 1) to provide a sample of the ramp signal 45 to be coupled through amplifier 48 into hold capacitor 50, which provides the voltage controlled oscillator input tuning voltage 62 (FIG. 5) or controlled signal. The linear ramp provided by the conventional sample-and-hold phase detector shown in FIG. 3 may be described by the equation:

$$V \text{ (at } C_1\text{)} = \frac{1}{C} \int_0^t i \, dt \quad (6)$$

The voltage 45 developed across hold capacitor 50 is coupled from the phase detector 16 through loop filter 18 into VCO 20 as the input tuning voltage 62. Referring to FIG. 5, it will be seen that under ideal conditions, the ideal input tuning voltage 62 will increase linearly as the frequency increases from the lower frequency limit $f_1$ to the upper frequency limit $f_2$. However, for most Varactor tuned oscillators, the relationship between output frequency 22 and input tuning voltage is non linear as shown by the equation:

$$f = KV^{\frac{1}{2}} \quad (7)$$

where:
  $f$ = the output frequency of the VCO
  $V$ = the input tuning voltage applied to the VCO Accordingly, the actual input tuning voltage required to drive the VCO to a new preselected frequency is indicated as 62 in FIG. 5. Further, retuning the VCO to a new frequency causes the phase locked loop loop-gain to vary. For example, the VCO gain is the first derivative of equation (7). For the ideal case, the first derivative of the equation of line 60 of FIG. 5 would be a straight line as indicated as 64 in FIG. 6, indictating a constant VCO gain in radians per second per volt across the frequency spectrum from the lower frequency $f_1$ to the upper frequency $f_2$. Since, however, the actual tuning voltage vs frequency characteristic is the curve 62 of FIG. 5, the curve described by equation (7), again taking the first derivative of equation (7).

$$G_{VCO} = df/dv = (\tfrac{1}{2})KV^{-\frac{1}{2}} \quad (8)$$

which indicates the non-linear VCO gain characteristic shown as line 66 of FIG. 6.

The present invention is directed to a method and apparatus for automatically compensating for the loop gain within the phase locked loop by providing an equal and opposite gain with respect to a change in frequency as is hereinafter described.

Figure 7:
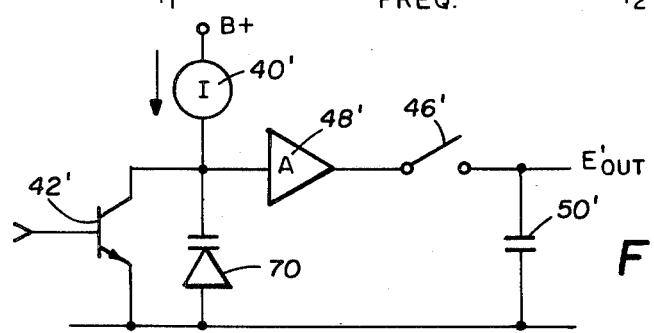
FIG. 7 is a schematic diagram of the sample-and-hold circuit of the present invention which incorporates a Varactor to provide a non-linear output ramp into the holding capacitor of the circuit.
Figure 8:
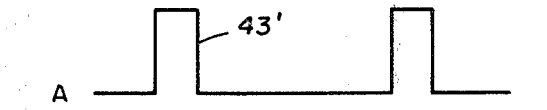
FIGS. 8(A and B) shows respectively the sample pulse timing and the non-linear ramp output voltage of the sample-and-hold circuit of FIG. 7.

Referring to FIG. 7, a circuit similar to that shown as the prior art FIG. 3 includes a constant current source 40 having a current diverted to ground through reset transistor 42 when a reset pulse 43 (shown in FIG. 8A) is applied to the base of transistor 42. As above described, a sampling switch 46 is operated in response to the output of programmable divider 24 to permit a signal to be coupled through amplifier 48 into hold capacitor 50. However, the ramp capacitor 44 of the sample and hold circuit in FIG. 3 has been replaced with a voltage variable capacitor or Varactor 70. Since the Varactor 70 provides a decreasing capacitance with an increasing voltage, the sample-and-hold phase detector of FIG. 7 provides a non-linear ramp 72 (shown in FIG. 8B).

The gain variation of the non-linear ramp phase detector required to tune a VCO from $f_1$ to $f_2$ for the non linear Varactor 70 is a variable of time and therefore the term "C" must remain inside the integral of equation (6) such that $$V = \int_o^t \frac{1}{C} i \, dt \qquad (9)$$

Recalling that for the Varactor, $$1/C = K_4 V^{(y)}$$

where y is the Varactor exponent, and i is constant current then, $$V = i \int_o^t K_4 V^y \, dt = K_5 \int_o^t V^y \, dt \qquad (10)$$

Since phase detector gain "G" is defined as the derivative of V with respect to time, $$G = \frac{dv}{dt} = \frac{d}{dt}\left(K_5 \int_o^t V^y \, dt\right) = K_5 V^y \qquad (11)$$

When phase lock occurs, the phase detector output voltage equals the VCO tuning voltage. The phase detector gain, G, may be expressed as a function of VCO frequency by substituting equation (4) into equation (11), so that:

$$G = K_5 V^y = K_5 \left(\left(\frac{f}{K_3}\right)^{2/x}\right)^y \qquad (12)$$

$$G = K_5 \left(\frac{f}{K_3}\right)^{2y/x}$$

Considering the phase detector gain at the lower and upper VCO frequencies $f_1$ and $f_2$ respectively, then:

$$G_1 = K_5 (f_1/K_3)^{2y/x},$$
and $$F_2 = K_5 (f_2/K_3)^{2y/x}$$

Thus, the gain ratio may be expressed as:

$$G_R = G_1/G_2 = (f_1/f_2)^{2y/x} \qquad (13)$$

To determine the total loop gain variation in tuning from the VCO lower frequency, $f_1$ to the VCO upper frequency, $f_2$, Recall that the Phase Locked Loop Loop gain is equal to $S_o \times G_o \times 1/N \times K_{DC}$, and, as above-decribed, $$S_R = (f_1/f_2)^{(x-2)/X} \qquad (5)$$
and $$G_R = (f_1/f_2)^{(2y/X)} \qquad (13)$$

Further, the program divider ($\div N$) ratio term becomes obvious by inspection, $$N_R = \text{Divider Ratio} = \frac{\frac{1}{N_1}}{\frac{1}{N_2}} = \frac{N_2}{N_1}$$

but $$N_2 = f_2/K_6$$
and $$N_1 = f_1/K_6$$

where $K_6$ is the Phase Locked Loop Reference Frequency so that $$N_R = f_2/f_1$$

or $$= (f_1/f_2)^{-1}.$$

Accordingly, the Phase Locked Loop ratio is seen to be:

$$(PLL)_R = \frac{PLL \text{ (Gain @ } f_1)}{PLL \text{ (Gain @ } f_2)} = S_R \times G_R \times N_R$$

or, $$(PLL) = (f_1/f_2)^{(x-2)/x} (f_1/f_2)^{2y/x} (f_1/f_2)^{-1}$$

which reduces to:

$$PLL_R = \left(\frac{f_1}{f_2}\right)^{((x-2)/x + 2y/x - 1)} \qquad (15)$$

$$= \left(\frac{f_1}{f_2}\right)^{(x-2+2y-x)/x}$$

$$(PLL)_R = \left(\frac{f_1}{f_2}\right)^{(2y-2)/x}$$

Using equation (11), a phase detector Varactor 70 is selected to have an exponent of y=1. Incorporating such a Varactor as the ramp capacitor in the Phase detector 16 will cause the PLL gain ratio to be unity for any $f_1$, $f_2$ and any VCO varactor 32, 33, having an exponent x.

By way of example, a VCO is tuned from 100 to 200 MHz, the VCO Varactor exponent is 0.40 and the Phase Locked Loop reference frequency is 25 kHz.

Case 1. Assuming no compensation is used in phase detector, the following loop gains can be expected:
for the VCO, $$S_{(100)}/S_{(200)} = (f_1/f_2)^{(X-2)/2} = 16.00,$$

for the linear phase detector, $$G_{(100)}/G_{(200)} = 1,$$

for the programable divider gain, $$N_{100} = (100 \times 10^6)/(25 \times 10^3) = 4000$$
and $$N_{200} = (200 \times 10^6)/(25 \times 10^6) = 8000$$

so that $$N_R = \frac{\frac{1}{N_1}}{\frac{1}{N_2}} = \frac{N_2}{N_1} = 2$$

thus, for the conventional phase detector described in the prior art and as illustrated in FIG. 3, the loop variation becomes 16×1×2 or a 32 to 1 variation in loop gain.

Case 2: Using a varactor in the compensating phase detector identical to those used in the VCO resonant circuit,
for the VCO, $$S_{100}/S_{200} = 16.00$$

for the Non-Linear Phase Detector, $$G_R = (f_1/f_2)^{2y/X}$$

and since $$X = Y = 0.4,$$

$$G_R = (100/200)^2 = 0.25$$

For the programable divider gain, $N_r$ is the same as in Case 1, so that the total loop variation becomes $16 \times 0.25 \times 2$ or a 4 to 1 gain variation on the loop, or 12 dB less variation in loop gain by using the non-linear phase detector of the present invention.

Case 3: Using a varactor with an exponent of 1 (i.e., y=1) in the compensating phase detector,
for the VCO, $$S_{100}/S_{200} = 16.00$$

for the Phase Detector, $$G_{100}/G_{200} = (100/200)^{(2 \times 1)/0.4} = 0.03125$$

and again, $N_R = 2$ so that the total loop variation reduces to:

$$\text{Total} = 16 \times (0.03125) \times 2 = 1.0 \text{ to } 1$$

or a phase locked loop loop-gain variation of 0 dB by utilizing a properly related non-linear ramp phase detector in a single-loop synthesized frequency generator.

Although a particular embodiment of the invention has been described herein, it will be understood that the actual hardware used will be dictated by the operating frequencies, power requirements and characteristics of the frequency generator in which the phase detector is to be used and that the embodiment disclosed is capable of rearrangement and modification without departing from the spirit of the invention.

I claim:

1. Apparatus for automatically compensating for non-linear variations in the gain characteristics of a multi-channel, single loop synthesized frequency generator which occur during tuning from a first frequency channel having a frequency, $f_1$, to a second frequency channel having a frequency, $f_2$, comprising:

a voltage controlled oscillator (VCO) incorporating a Varactor tuned resonant circuit and having an input and an output;

a sample-hold phase detector circuit having an output connected to the input of said VCO;

a feed back loop conductor interconnecting the output of said VCO to said phase detector to form a phase locked loop frequency generator, and gain compensation means interconnected in said phase detector and responsive to the first channel frequency, $f_1$, and the second channel frequency, $f_2$, for reducing non-linear variations in loop gain to 0 db when tuning the frequency generator from $f_1$ to $f_2$.

2. The apparatus of claim 1, wherein said gain compensation means is a Varactor having characteristics selected to compensate for the sum of individual loop gains occuring within said VCO, said phase detector and said feedback loop during tuning from $f_1$ to $f_2$.

3. The apparatus of claim 1 further including bias means for providing a bias voltage signal having a magnitude sufficient to overcome the inherent contact potential of said resonant circuit tuning Varactor.

4. The apparatus of claim 3 wherein said bias means is a transistor interconnected into the tuning loop, said transistor biased to interact with the tuning loop by generating a potential signal equal and opposite to said resonant circuit tuning Varactor contact potential.

* * * * *